United States Patent [19]
Aoyama et al.

[11] Patent Number: 5,940,708
[45] Date of Patent: Aug. 17, 1999

[54] METHOD FOR PRODUCTION OF SEMICONDUCTOR INTEGRATED CIRCUIT DEVICE

[75] Inventors: Masashige Aoyama, Oizumi-machi; Kazuhiro Yoshitake, Ota, both of Japan

[73] Assignee: Sanyo Electric Co., Ltd., Osaka, Japan

[21] Appl. No.: 08/690,485

[22] Filed: Jul. 31, 1996

[30] Foreign Application Priority Data

Jul. 31, 1995 [JP] Japan .................................. 7-195093

[51] Int. Cl.⁶ ..................... H01L 21/8234; H01L 21/336
[52] U.S. Cl. ....................... 438/275; 438/287; 438/305; 257/500
[58] Field of Search .................................. 438/275, 301, 438/305, 287; 257/500, 501

[56] References Cited

U.S. PATENT DOCUMENTS

| | | | |
|---|---|---|---|
| 4,342,149 | 8/1982 | Jacobs et al. | 438/275 |
| 5,015,595 | 5/1991 | Wollesen . | |
| 5,216,272 | 6/1993 | Kubokoya et al. . | |
| 5,234,853 | 8/1993 | Ikemasu | 438/275 |
| 5,449,637 | 9/1995 | Saito et al. | 438/275 |
| 5,550,067 | 8/1996 | Kuroyanagi et al. | 438/275 |
| 5,576,570 | 11/1996 | Ohsawa et al. | 257/369 |
| 5,583,061 | 12/1996 | Williams et al. | 438/275 |
| 5,622,878 | 4/1997 | Beasom | 438/218 |
| 5,696,400 | 12/1997 | Yoshida et al. | 257/392 |

FOREIGN PATENT DOCUMENTS

| | | |
|---|---|---|
| 0535674 | 10/1992 | European Pat. Off. . |
| 62-095873 | 5/1987 | Japan . |
| 5160351 | 6/1993 | Japan . |
| 5343670 | 12/1993 | Japan . |

OTHER PUBLICATIONS

Isao Yoshida, et al. "Device Design of an Ion Implanted High Voltage MOSFET" Journal of the Japan Society of Applied Physics, vol. 44, 1975, pp. 249–255.

Michael Smayling, et al., "A Modular Merged Technology Process Including Submicron CMOS Logic, Nonvolatile Memories, Linear Functions, and Power Component", IEEE 1993 Custom Integrated Circuits Conference.

Vlado Valencic, et al., "50–V LCD Driver Integrated in Standards 5–V CMOS Process", IEEE 1994 Custom Integrated Circuits Conference, pp. 578–584.

H. Ballan, et al., "Design and Optimization of High Voltage Analog and Digital Circuit Built in a Standard 5V CMOS Technology", IEEE 1994, Integrated Circuits Conference pp. 574–577.

Frank Myers, et al., "Integration of High Voltage Transistors into a 1.5 Micron CMOS Process for LCD Driver Applications" IEEE 1993 Custom Integrated Circuits Conference.

M. Declercq, et al., "Design and Optimization of High–Voltage CMOS Devices Compatible with a Standard 5V CMOS Technology", IEEE 1993 Custom Integrated Circuits Conference.

Krishna C. Saraswat, et al., "A High Voltage MOS Switch", IEE Journal of Solid–State Circuits, vol. SC–10, No. 3. Jun. 1975, pp. 136–142.

*Primary Examiner*—Richard A. Booth
*Attorney, Agent, or Firm*—Loeb & Loeb LLP

[57] ABSTRACT

A method for the production of a semiconductor integrated circuit device is disclosed, wherein the formation of lateral wall spacers for high voltage MOS transistor is implemented by forming a resist film for covering at least an insulating film formed on a drain region of low impurity concentration in the proximity of a gate electrode, masking the resist film, and etching the parts of the insulating film destined to give rise to the lateral wall spacers.

5 Claims, 17 Drawing Sheets

METHOD FOR PRODUCTION OF SEMICONDUCTOR INTEGRATED CIRCUIT DEVICE

BACKGROUND OF THE INVENTION

1. Field of the Invention

This invention relates to a method for the production of a semiconductor integrated circuit device and more particularly to a method for the production of a semiconductor integrated circuit device provided with a high voltage MOS transistor, which method is characterized by allaying the leak current consequent on the high voltage MOS transistor and, at the same time, stabilizing the characteristics of the MOS transistor of an LDD (light doped drain) structure.

2. Description of the Prior Art

The semiconductor integrated circuit devices which are provided with a high voltage MOS transistor have been heretofore used in the field of drivers for operating such microcomputers and liquid crystal panels as incorporate therein an FLT (fluorescent light tube) driver. The targets, viz exaltation of voltage difference between two terminals and miniaturization, that are set for the transistors primarily are physically irreconcilable requirements. The development of the semiconductor integrated circuit devices of this class, therefore, incurs various technical problems. One of these problems concerns the leak current which occurs when the device adopting the MOS transistor of the so-called LDD structure for the sake of miniaturization is in the turn OFF state. This problem will be explained below with reference to FIGS. 1~5.

With reference to FIG. 1, a P well 32 is formed on an N type Si substrate 31 and a field oxide film 33 is formed in areas requiring element separation such as, for example, the boundary between the P well 32 and the N type Si substrate 31.

The periphery of the P well 32 is surrounded by the field oxide film 33 and a gate insulating film 34B is formed on the surface of the P well 32. A gate electrode 35B is formed on the gate insulating film 34B. In the surface layer of the P well 32, an $N^-$ type source layer 37 and an $N^-$ type drain layer 38 are formed by ion implantation as opposed to each other across the gate electrode 35B.

Further, the field oxide film 33 is formed on the surface of the N type Si substrate 31 in which the P well 32 is not formed, a gate insulating film 34A is formed on the surface of the active area surrounded by the field oxide film 33, and a gate electrode 35A is formed on the surface of the gate insulating film 35A as shown in FIG. 1.

Further, a $P^-$ drain layer 36 is formed on the surface of the N type Si substrate 31 falling on one side of the gate electrode 35A. A CVD oxide film 39 is formed so as to cover all the surfaces formed consequently.

The CVD oxide film 39 in the ensuing state is etched without the resist covered area thereof by anisotropic etching such as, for example, the RIE (reactive ion etching) to form lateral wall spacer films 40 one each on the lateral walls of the gate electrodes 35A, 35B as shown in FIG. 2. During the process of this etching, the surface of the Si substrate is etched over and damage layers 41 containing such faults as a crystal defect are formed on the etched surfaces by the impact of ions which are etching species.

Then, by selectively injecting a $P^+$ type impurity atoms, a $P^+$ type source region 42 is formed on the surface of the N type Si substrate 31 opposite the $P^-$ drain region 36 across the gate electrode 35A and, at the same time, a $P^+$ type drain region 43 is formed in the surface region of the $P^-$ drain region 36 as shown in FIG. 3. Subsequently, by selectively introducing an $N^+$ type impurity atoms, an $N^+$ type source region 44 and an $N^+$ type drain region 45 are formed on the P wells 32 on the opposite sides of the gate electrode 35B.

In consequence of the process described above, a P channel high voltage MOS transistor is formed on the surface of the N type Si substrate 31 and an N channel MOS transistor (normal voltage MOS transistor) is formed on the surface of the P well 32.

Incidentally, it has been confirmed that in the high voltage MOS transistor formed in consequence of the process described above, a damage layer 41A to be formed on the surface of the $P^-$ type drain layer 36 induces occurrence of a leak current from the $P^-$ type drain layer 36 to the N type Si substrate 31.

The occurrence of this leak current may be logically explained by a supposition that when a high voltage is applied to the drain of the high voltage MOS transistor, the $P^-$ type drain region 36 undergoes depletion of carriers and the depletion region widens as far as the damage layer 41A in the proximity of the gate electrode and, as a result, the generation current occurred by recombination-generation centers due to the crystal defect inevitably flows from the damage layers 41 to the N type Si substrate 31.

For the purpose of preventing this leak current, the present inventors have tried a procedure which comprises performing isotropic etching such as, for example, the wet etching which causes etching damage only sparingly and thereby forming the lateral wall spacer films 40 and subsequently removing the damage layers 41 as shown in FIG. 4 and thereafter forming the $P^+$ type source layer 42, the $P^+$ type drain layer 43, an $N^+$ type source layer 44, and an $N^+$ type drain layer 45 as shown in FIG. 5.

This procedure has resulted in removing the damage layers and, as a result, allaying the leak current mentioned above. Since the isotropic etching allows only poor control of the amounts of Si side-etching, however, it entrains such disadvantages as rendering ununiform the intervals (a) between the adjacent edges formed as shown in FIG. 4 by the etching and consequently impairing the constancy of the transistor characteristics like the ON resistance.

Incidentally, when the removal of the damage layer 41 of Si surface is effected by anisotropic etching, the work of etching can be carried out as critical dimension controlled without entraining such poor control of the amount as side etching. The anisotropic etching does not allow perfect prevention of the leak current, however, because it gives rise to damage layers again.

Further, a procedure which comprises forming the gate electrodes 35A, 35B with polysilicon and thereafter performing a thermal oxidation and thereby forming a relatively thick oxide film on the $P^-$ type drain layer 36 and consequently preventing the $P^-$ type drain layer 36 from being exposed during the subsequent course of anisotropic etching is conceivable.

When the gates are formed of polysilicon, however, they are at a disadvantage in hampering any effort to exalt the operating speed of a device because the polysilicon layers offer such a relatively high resistance as falls in the neighborhood of 30 $\Omega/\square$. The adoption of a polycide gate structure, namely a two-layer structure of tungsten and polysilicon, which offers low resistance in the approximate range of 8~10 $\Omega/\square$ as compared with the polysilicon gates, therefore, has been tried. The adoption of this structure, however, entrains the problem that a tungsten polycide layer peels from the polysilicon layer during the course of thermal oxidation of the two-layer structure. Therefore, the polycide structure can not be used the thermal oxidation.

SUMMARY OF THE INVENTION

It is an object of this invention to provide a method for the production of a semiconductor integrated circuit device furnished with a high voltage and low circuit device furnished with a high voltage and low resistance gate electrode MOS transistor, which method is characterized by allaying the leak current in the high voltage MOS transistor or the leak current in the MOS transistor of the LDD structure, low gate electrode resistance and also stabilizing the characteristics of the MOS transistor of the LDD structure.

In accordance with this invention, since the formation of a lateral wall spacer for the high voltage MOS transistor is implemented by forming an insulating film as a constituent of the lateral spacer, forming a resist film for covering at least the part of the insulating film that overlies a lightly doped drain region in the proximity of a gate electrode, and etching the insulating film as masked by the resist film and consequently forming a lateral wall spacer derived from the insulating film on the gate electrode, the surface of the lightly doped drain region is not covered with oxide by the etching step. Therefore the surface is not damaged by the charged etching ion.

This invention, therefore, permits the preclusion of the leak current which arises from the damage on the surface of the light doped drain region in the proximity of the gate electrode when the device is in the turn OFF state.

DESCRIPTION OF THE PREFERRED EMBODIMENTS

Now, a method for production according to an embodiment of this invention will be described in detail below.

The semiconductor integrated circuit devices that are manufacturable by this method of production comprise high voltage transistors and CMOS transistors. The following description of this method of production exclusively covers the n channel MOS transistor but leaves out the p channel MOS transistor.

Figure 6:
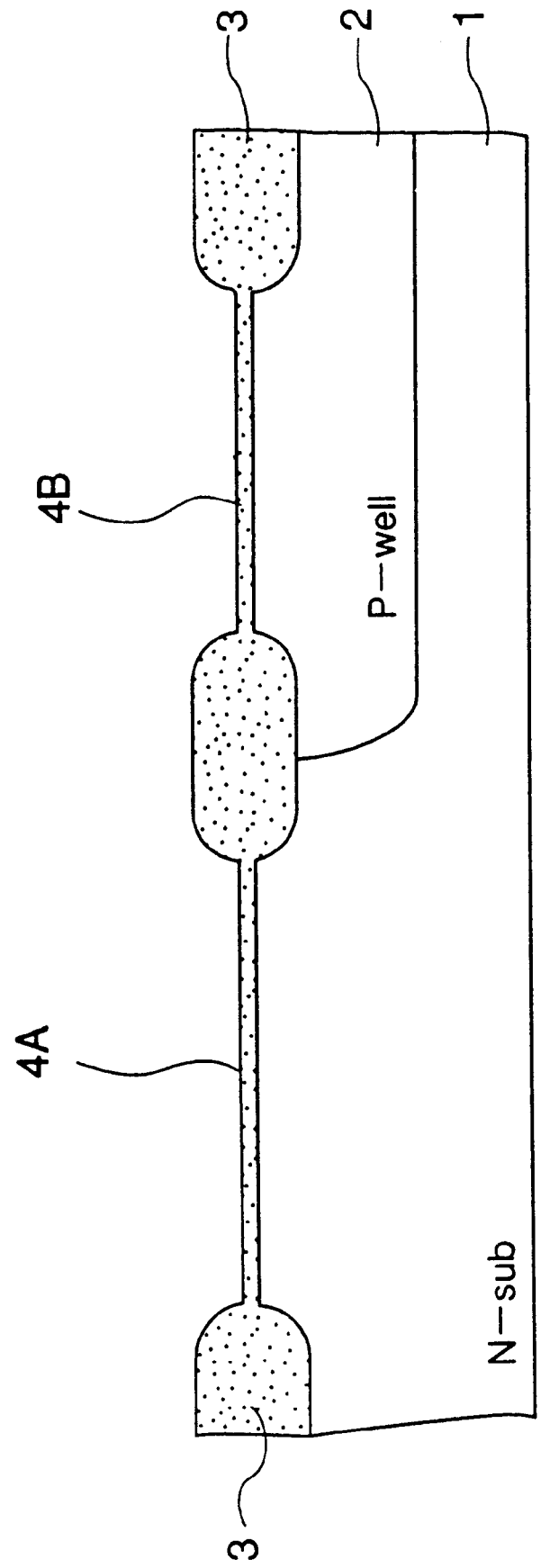
FIG. 6 is a first cross section showing a method for the production of a semiconductor integrated circuit device according to an embodiment of this invention.

First, as shown in FIG. 6, a P well 2 is formed by introducing and diffusing boron in part of the area of N type substrate, a field oxide film 3 is formed by the selective oxidation method, and the surface of the substrate 1 is thermally oxidized to form a first and a second gate insulating film 4A, 4B, approximately 150 Å in thickness, in the area other than that of the field oxide film 3. The first gate insulating film 4A is destined to form a gate insulating film of the P channel high voltage MOS transistor and the second gate insulating film 4B is destined to form a gate insulating film of the normal voltage N channel MOS transistor.

Figure 7:
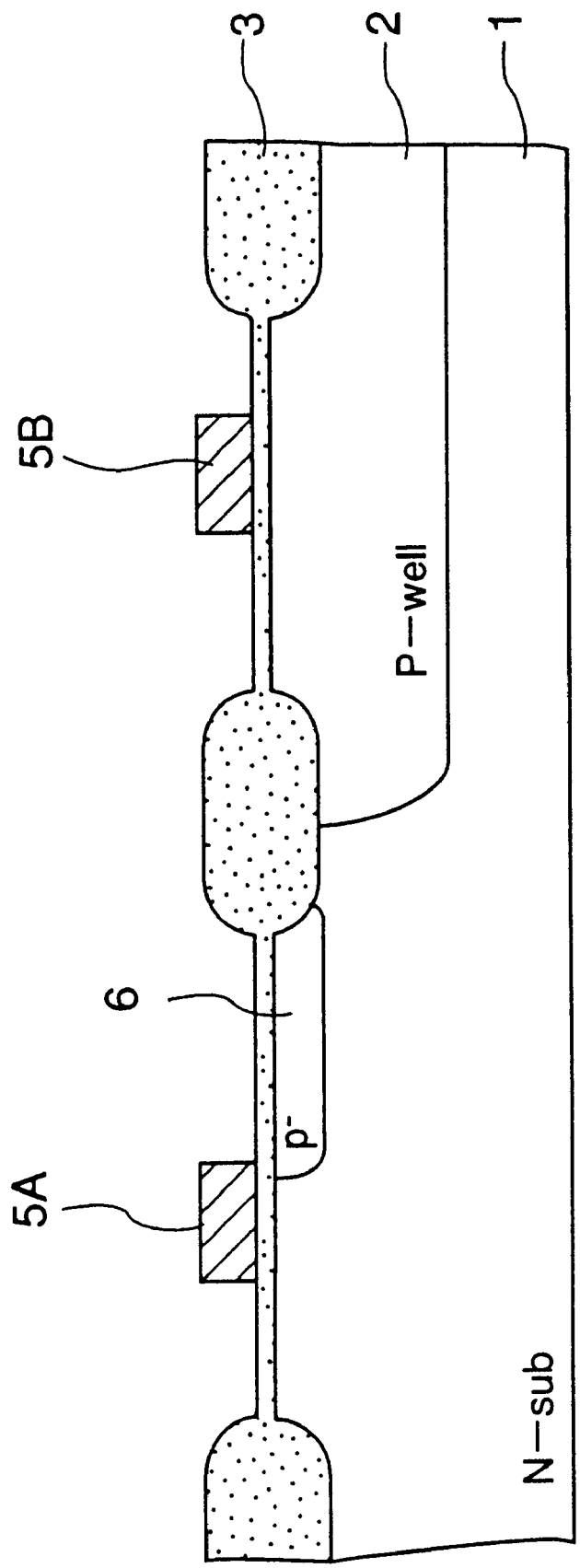
FIG. 7 is a second cross section showing a method for the production of a semiconductor integrated circuit device according to the embodiment of this invention.

Next, as shown in FIG. 7, a first and a second gate electrode 5A, 5B are formed respectively on the first and the second gate insulating film 4A, 4B. In order that the device may acquire an exalted operating speed, these first and second gate electrodes 5A, 5B adopt, for example, the so-called polycide structure which is formed by superposing a high melting metal such as tungsten silicide on polysilicon.

Then, a P$^-$ type lightly doped drain region is formed on one side of the first gate electrode 5A by selectively low dose ion implantation boron (B+) at the site indicated. This P$^-$ type drain region 6 is intended for moderating the electric field generated by the exertion of a high voltage on the drain. The conditions for the ion implantation and the conditions for the subsequent diffusion are determined to meet the specification for high voltage.

To guarantee the resistance to 50 V, for example, the amount of boron to be implanted is set at $3.5 \times 10^{12}/cm^2$ and the acceleration energy at 35 KeV and the subsequent diffusion of boron is performed at 1100° C. for about 18 hours. As a result, the P$^-$ type drain region 6 is formed as diffused in a junction depth of about 2 μm and a junction width of 1.6 μm. Though this embodiment of the invention limits this step to the formation of the P⁻ type drain region 6 alone, this step may further comprise simultaneous formation of a P⁻ type source region as opposed to the P⁻ type drain region 6 across the gate electrode 5A.

Figure 8:
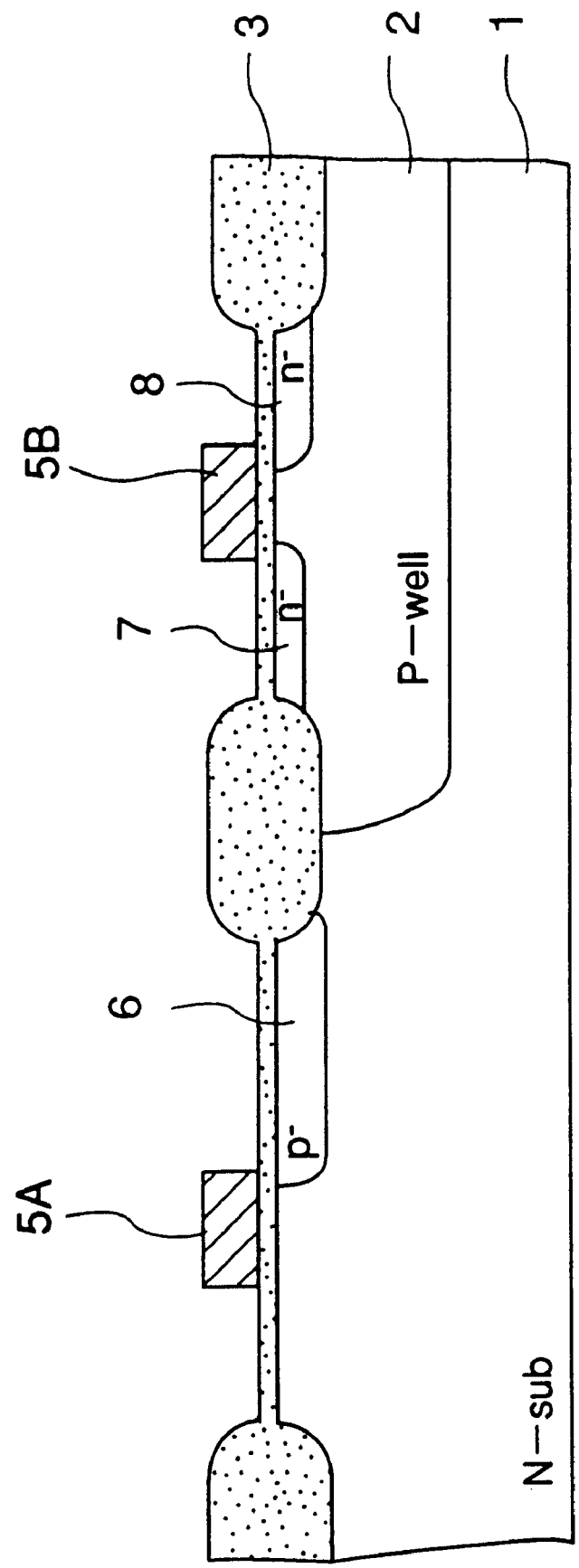
FIG. 8 is a third cross section showing a method for the production of a semiconductor integrated circuit device according to the embodiment of this invention.

Then, an N⁻ type source region 7 and an N⁻ type drain region 8 are formed on the opposite sides of the second gate electrode 5B as shown in FIG. 8 by selectively introducing an N type impurity atom at the sites indicated.

Figure 9:
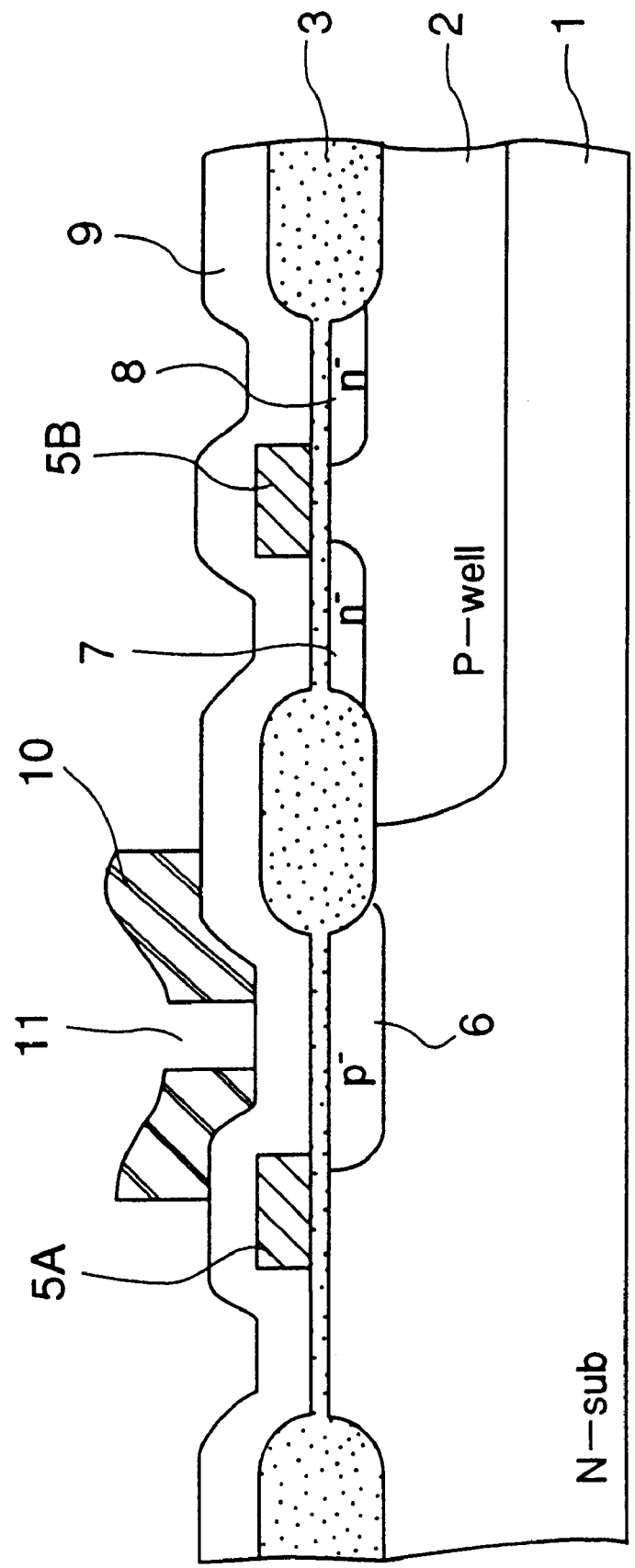
FIG. 9 is a fourth cross section showing a method for the production of a semiconductor integrated circuit device according to the embodiment of this invention.

Subsequently, a CVD oxide film 9 is formed on the whole surface including the first and the second gate electrode 5A, 5B by the LPCVD (low pressure chemical vapor deposition) technique and, thereafter, a resist film 10 is formed on the whole surface of the CVD oxide film 9 and it is selectively formed by photolithography method so as to encircle the peripheral part of the P⁻ type drain region 6 and form an opening 11 in the central part of the P⁻ type drain region as shown in FIG. 9.

This opening 11 is formed at a position separated by 8 μm from the end part of the first gate electrode 5A and by 8 μm from the end part of the field oxide film 3 and is extended by 6 μm in the lateral direction. These dimensions are variable proportionately with the thickness of the gate insulating films 4A, 4B. When the thickness of the gate insulating films 4A, 4B is 440 Å, for example, it suffices to form the opening 11 at a position separated by about 3.8 μm from the end part of the first gate electrode 5A and by about 3.8 μm from the end part of the field oxide film 3 and with a lateral extension of about 3.6 μm.

Figure 10:
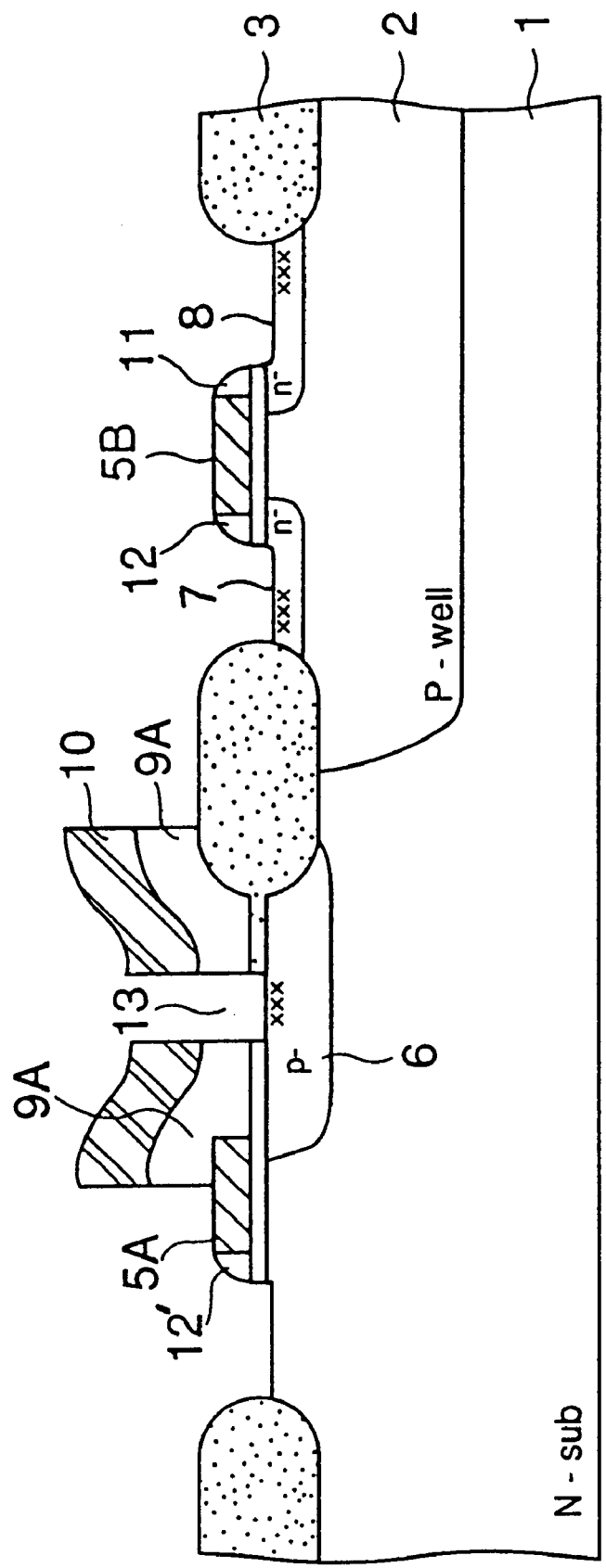
FIG. 10 is a fifth cross section showing a method for the production of a semiconductor integrated circuit device according to the embodiment of this invention.

Then, the CVD oxide film 9 is anisotropically etched with a mixed gas such as $CHF_3$ and $CF_4$ as shown in FIG. 10. As a result, a lateral wall spacer film 12 is formed on each of the lateral walls of the second gate electrode 5B and a lateral wall spacer 11 is also formed on one lateral wall of the first gate electrode 5A. Though the use of the mixed gas such as $CHF_3$ and $CF_4$ is indicated here, it is not critical for the present invention.

At this etching step, the CVD oxide film 9 is removed, an opening 13 is formed, and the surface of the P⁻ drain region 6 is exposed in the area in which the opening 11 has been formed in the resist film 10. The exposed surface would reveal damage if it sustained one during the etching work. Since the area embracing the P⁻ type drain region 6 and including the neighborhood of the gate electrode 5B and that of the field oxide film 3 is coated with the resist film 10, the etching step under discussion neither exposes the area embracing the P⁻ type drain region 6 nor inflicts any etching damage in this area.

The method of production according to the present embodiment, therefore, prevents the etching step mentioned above from producing a damage layer by etching the surface in area embracing the P⁻ type drain region 6 and including the neighborhood of the gate electrode 5B and that of the field oxide film 3. It is accordingly capable of allaying the leak current which has been heretofore caused by this damage layer while the device is in the turn OFF state.

Figure 11:
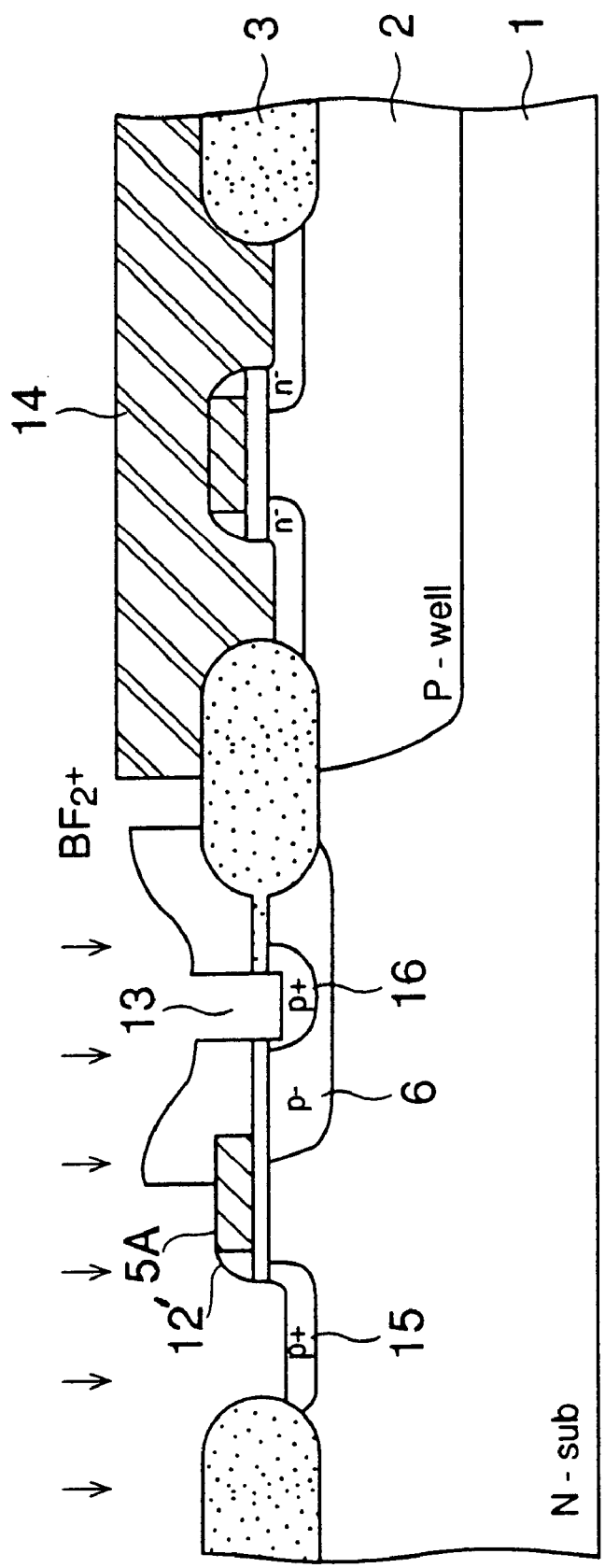
FIG. 11 is a sixth cross section showing a method for the production of a semiconductor integrated circuit device according to the embodiment of this invention.

Then, the resist film 10 is removed, a P⁺ type source region 15 is formed by covering the P well 2 with a resist film 14 and ion implanting $BF_2^+$, a P type impurity and, at the same time, a P⁺ type drain region 16 is formed by ion implanting the $BF_2^+$ via the opening 13 under the conditions of a dose of $2\times10^{15}/cm^2$ and an acceleration energy 60 keV as shown in FIG. 11.

Figure 12:
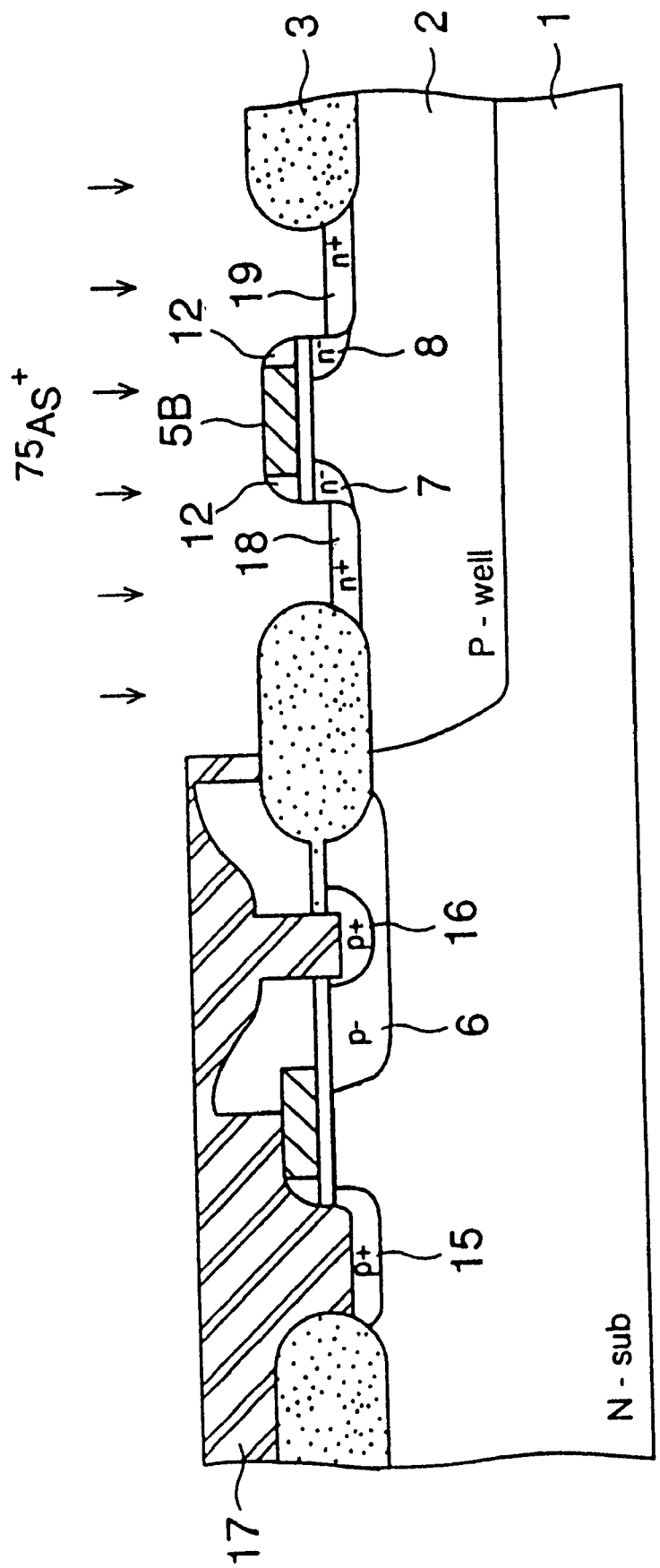
FIG. 12 is a seventh cross section showing a method for the production of a semiconductor integrated circuit device according to the embodiment of this invention.

Then, the resist film 14 is removed, the area of the substrate 1 from which the P well 2 is absent is covered with a resist film 17, and an N⁺ type source region 18 and an N⁺ type drain region 19 are formed severally on the opposite sides of the second gate electrode 5B by implanting As⁺ ion under the conditions of a dose of $5\times10^{15}/cm^2$ and an acceleration energy of 80 KeV as shown in FIG. 12.

Figure 13:
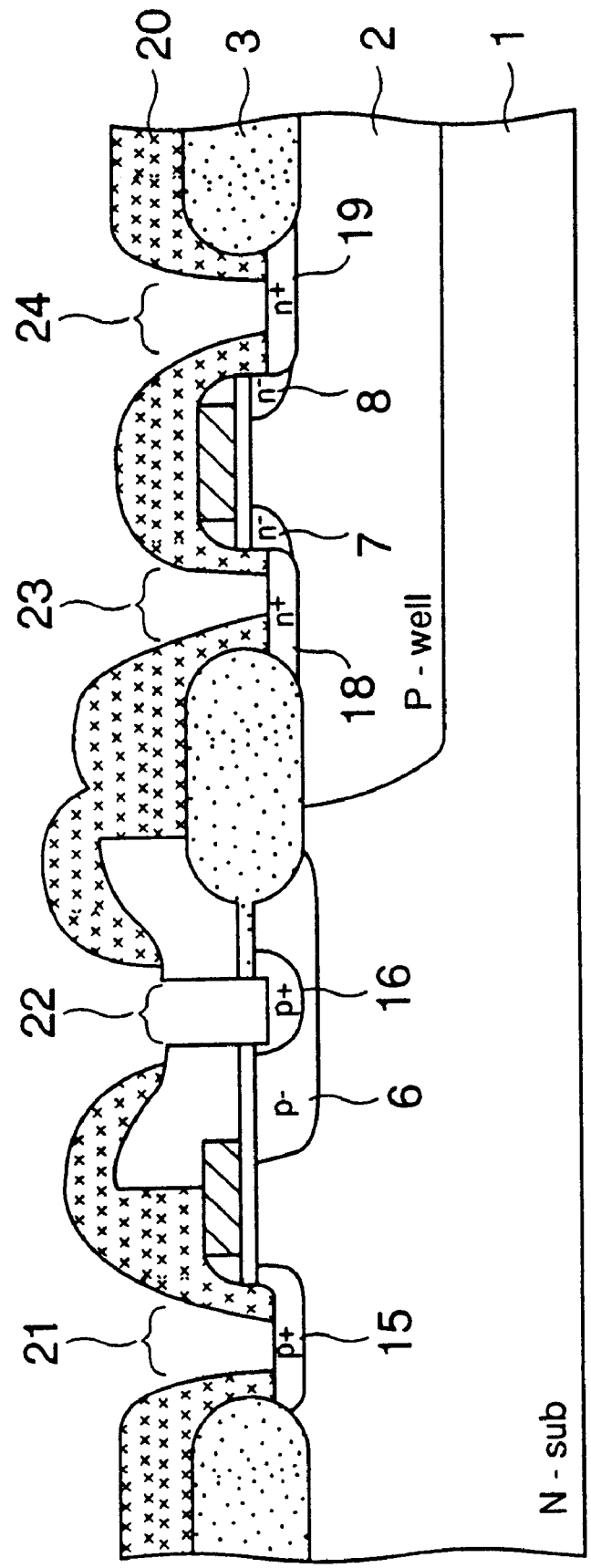
FIG. 13 is an eighth cross section showing a method for the production of a semiconductor integrated circuit device according to the embodiment of this invention.

Subsequently, the resist film 17 is removed, an interlayer insulating film 20 of BPSG is formed on the whole surface by the normal pressure CVD technique, and this film 10 is etched selectively to form contact holes 21, 22, 23, and 24 respectively on the P⁺ type source region 15, the P⁺ type drain layer 16, the N⁺ type source region 18, and the N⁺ type drain region 19 as shown in FIG. 13.

Figure 14:
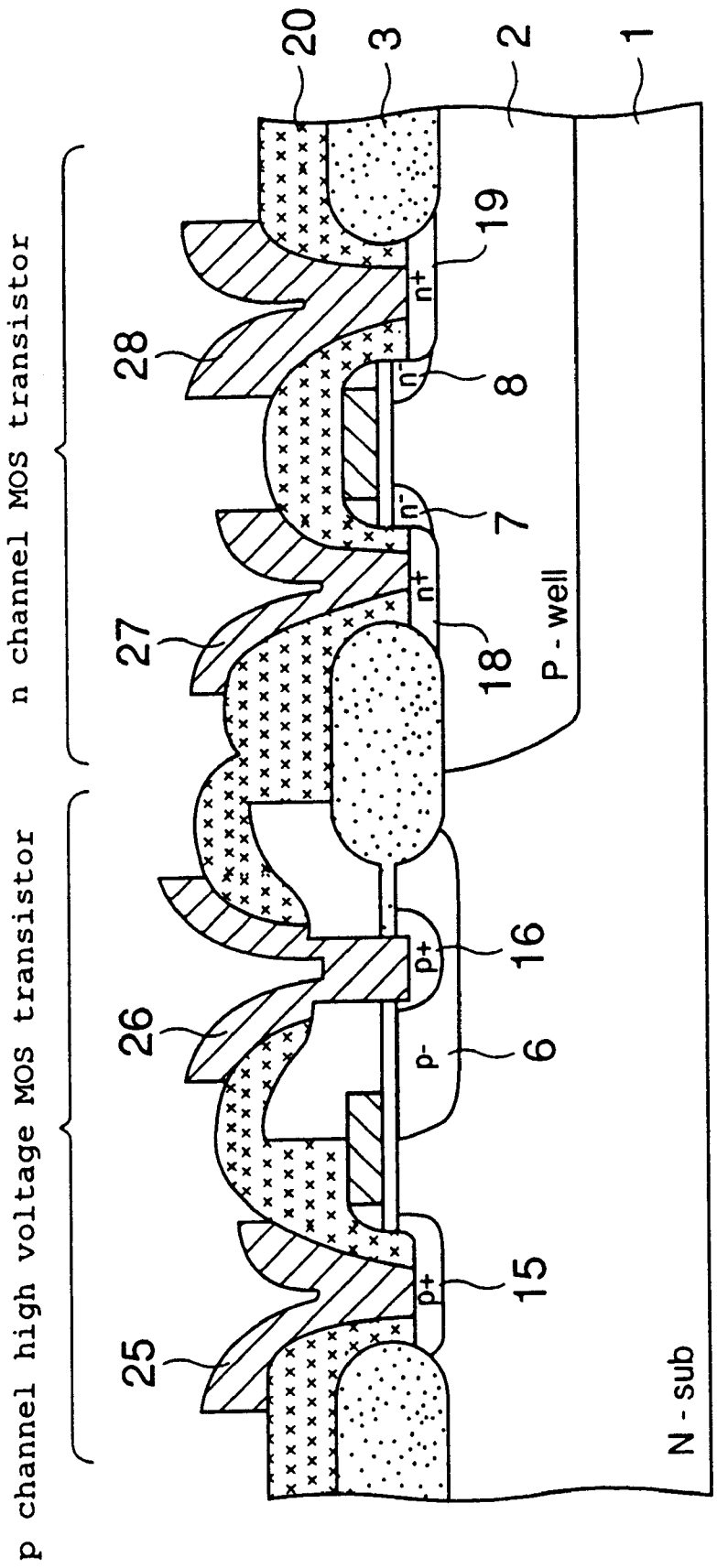
FIG. 14 is a ninth cross section showing a method for the production of a semiconductor integrated circuit device according to the embodiment of this invention.

Then, electrode layers 25, 26, 27, and 28 adapted to contact the P⁺ type source region 15, the P⁺ type drain region 16, the N⁺ type source region 18, and the N⁺ type drain region 19 are respectively formed via the contact holes 21, 22, 23, and 24 as shown in FIG. 14. A semiconductor integrated circuit device which is provided with both a CMOS incorporating therein a normal voltage n channel MOS transistor and a p channel high voltage MOS transistor, therefore, is completed.

The embodiment described above allows the miniaturization of the device because the ordinary transistor assumes the so-called LDD structure and also allows the prevention of the leak current due to a crystal defect because the surface of the P⁻ type drain region 6 escapes being etched during the formation of the lateral wall spacer films 12. Further, since the P⁺ type drain region 16 is formed by the ion implantation through the implantation mouth 13, the possibility of the P⁺ type drain region 16 suffering from misalignment is nothing.

Figure 15:
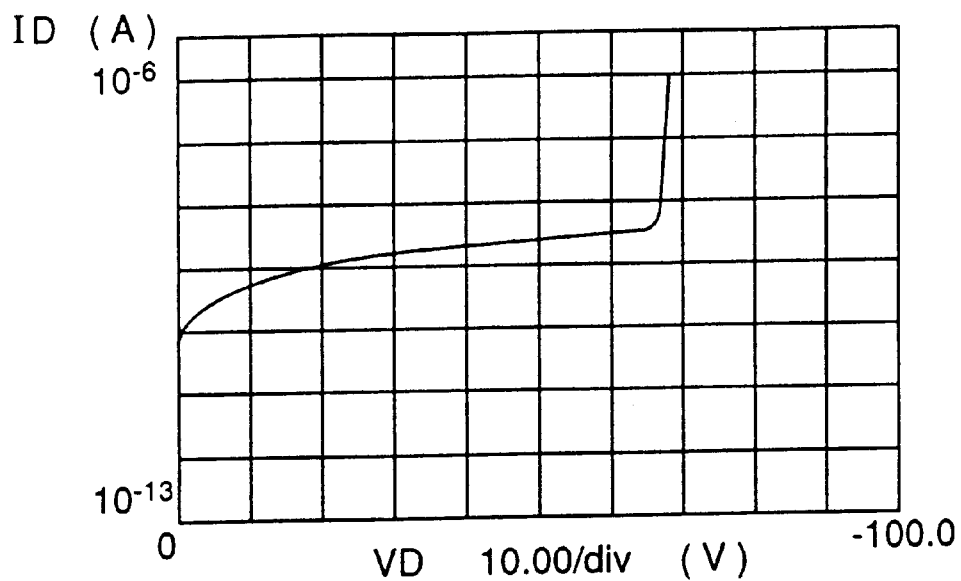
FIG. 15 is a first diagram showing the results of a measurement of a conventional high voltage MOS transistor for leak current.
Figure 16:
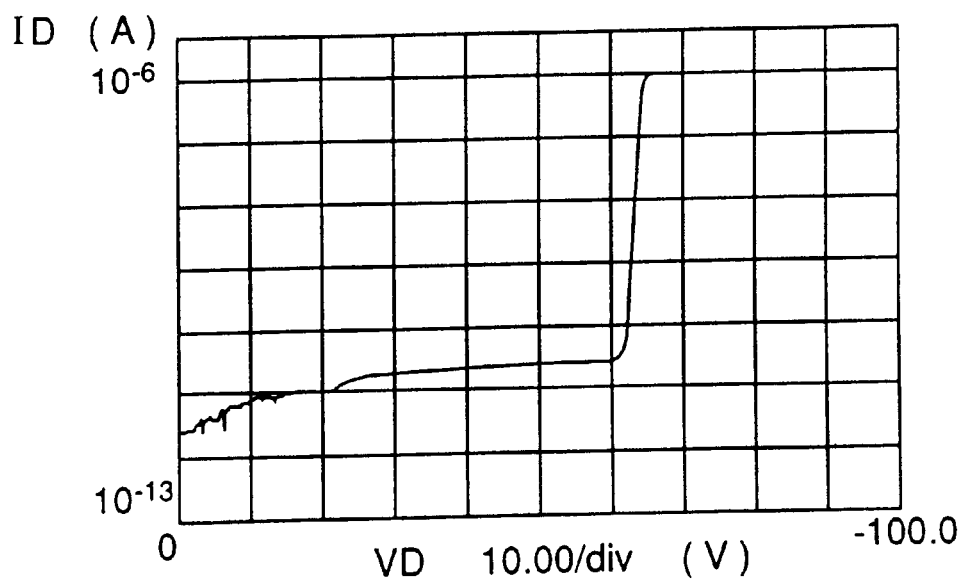
FIG. 16 is a second diagram showing the results of a measurement of a conventional high voltage MOS transistor for leak current.
Figure 17:
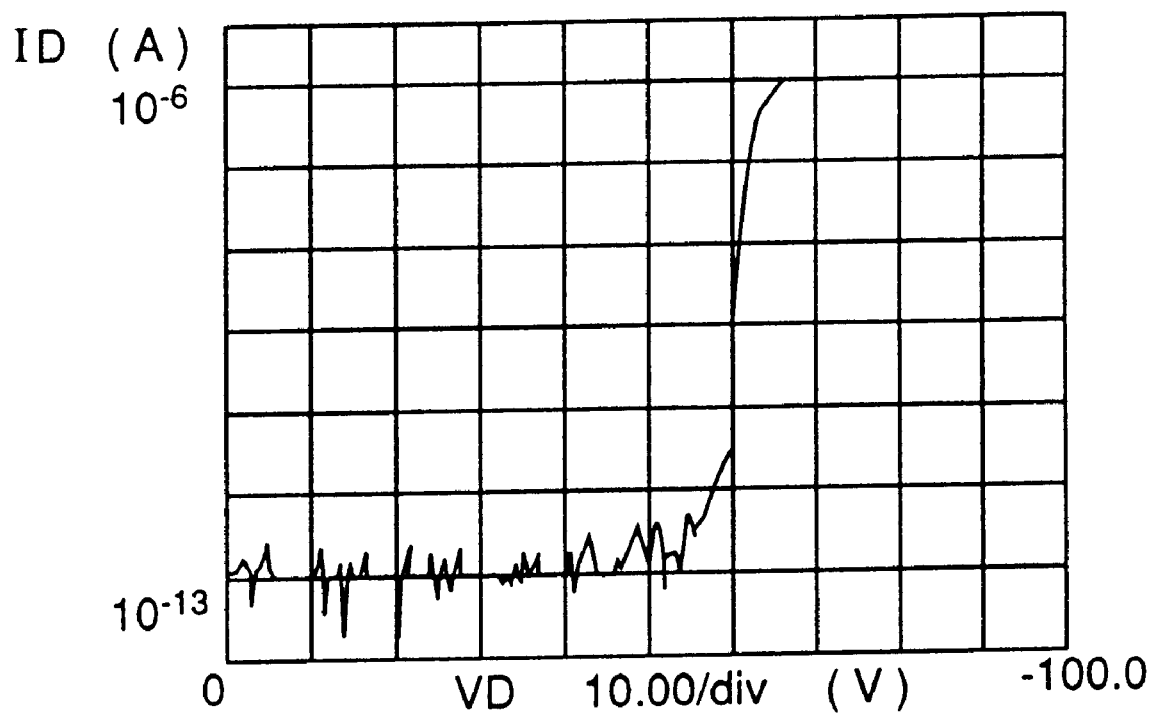
FIG. 17 is a diagram showing the results of a measurement of a high voltage MOS transistor according to an embodiment of this invention for leak current.

To confirm the effect of this invention, the high voltage MOS transistor was measured for leak current. The results of this measurement are shown in FIGS. 15~17. In the test, the source, gate, and N type substrate of the high voltage MOSFET were kept grounded and meanwhile a negative voltage VD was applied to the drain and the drain current ID was measured. The channel length of the transistor was about 3 μm and the channel width thereof was about 50 μm.

Figure 1:
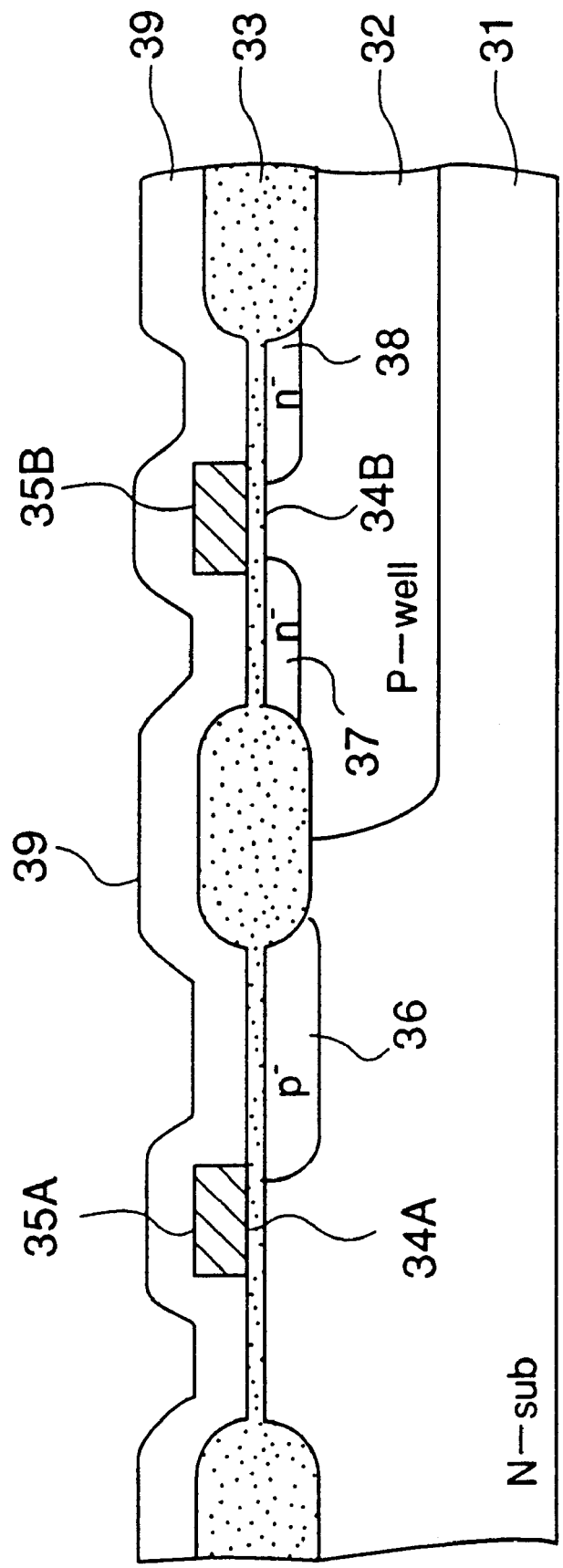
FIG. 1 is a first cross section showing a method for the production of a conventional semiconductor integrated circuit device.
Figure 2:
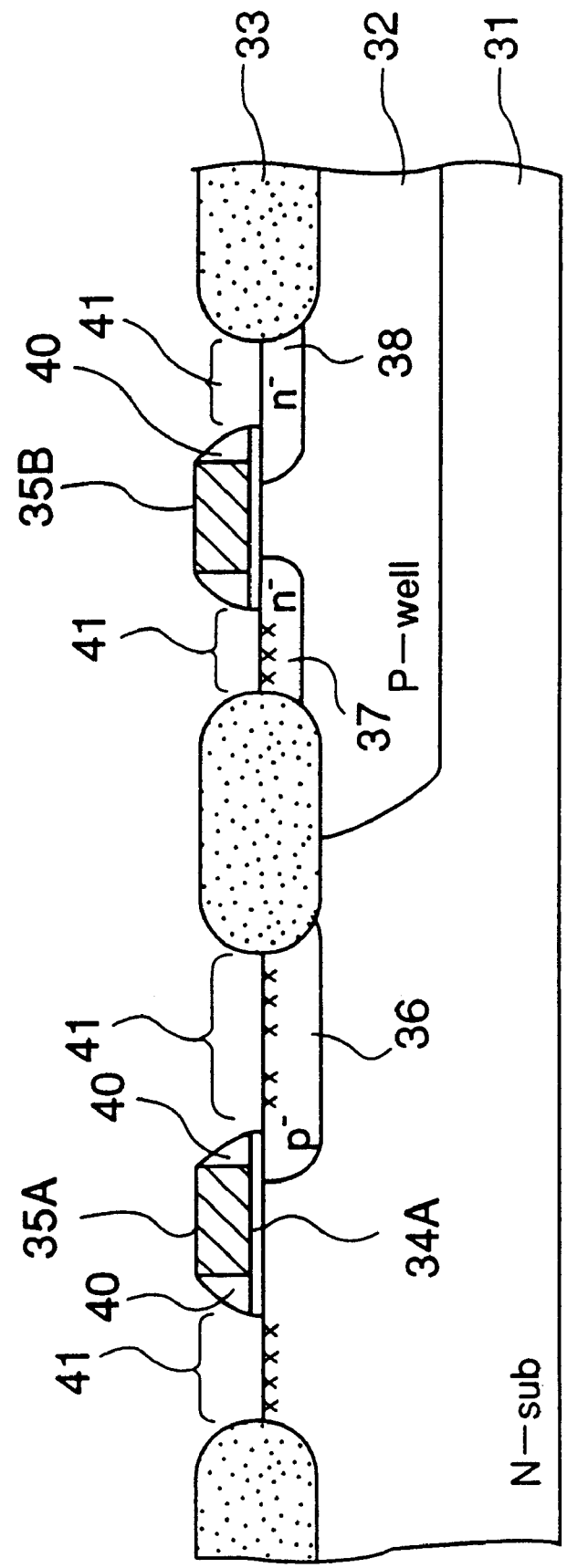
FIG. 2 is a second cross section showing a method for the production of a conventional semiconductor integrated circuit device.
Figure 3:
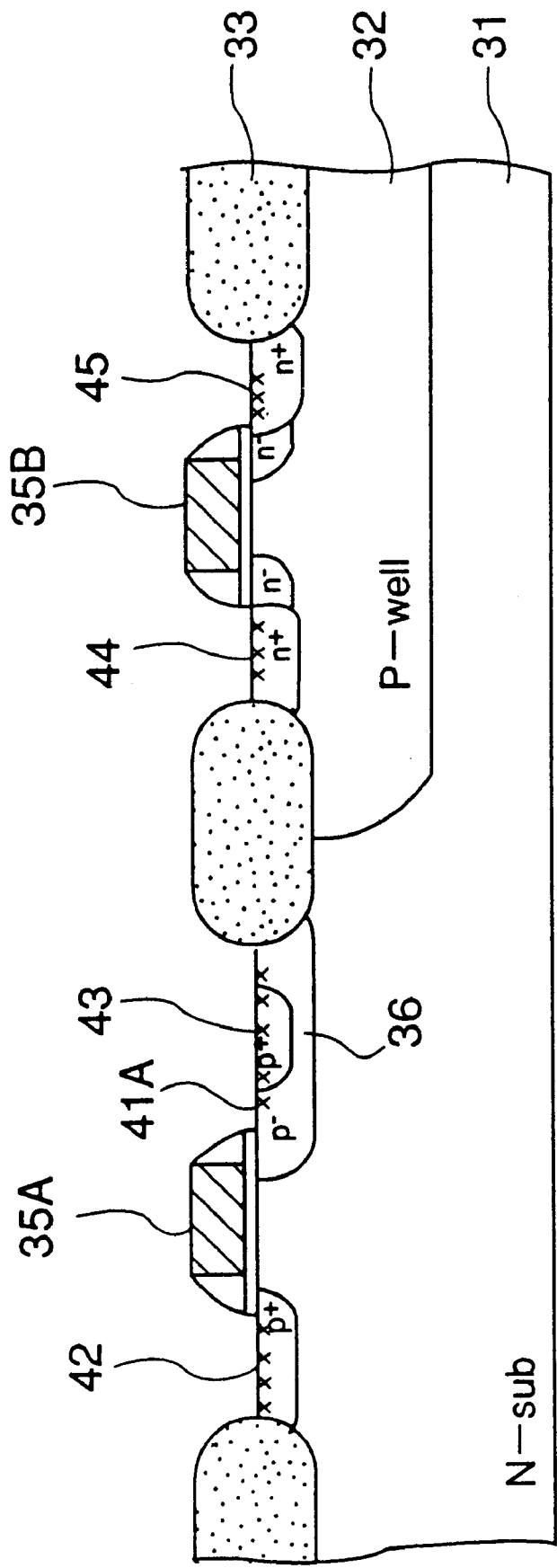
FIG. 3 is a third cross section showing a method for the production of a conventional semiconductor integrated circuit device.
Figure 4:
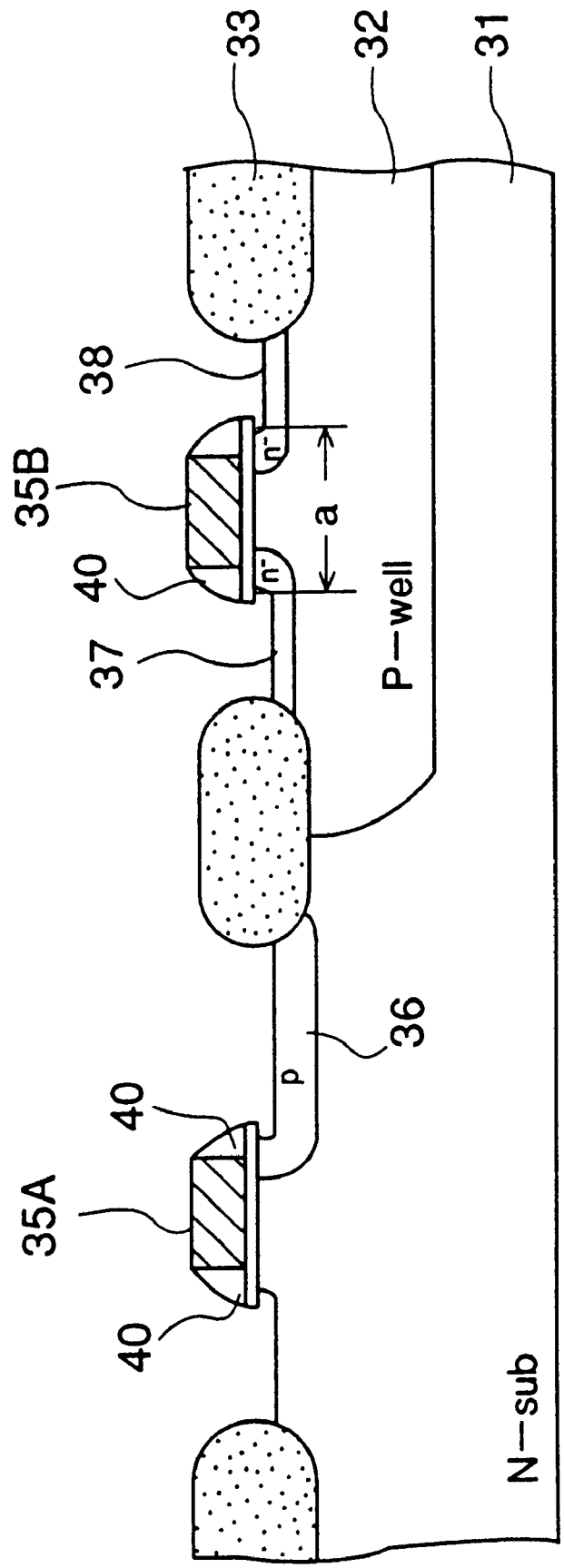
FIG. 4 is a first cross section showing a method for the production of another conventional semiconductor integrated circuit device.
Figure 5:
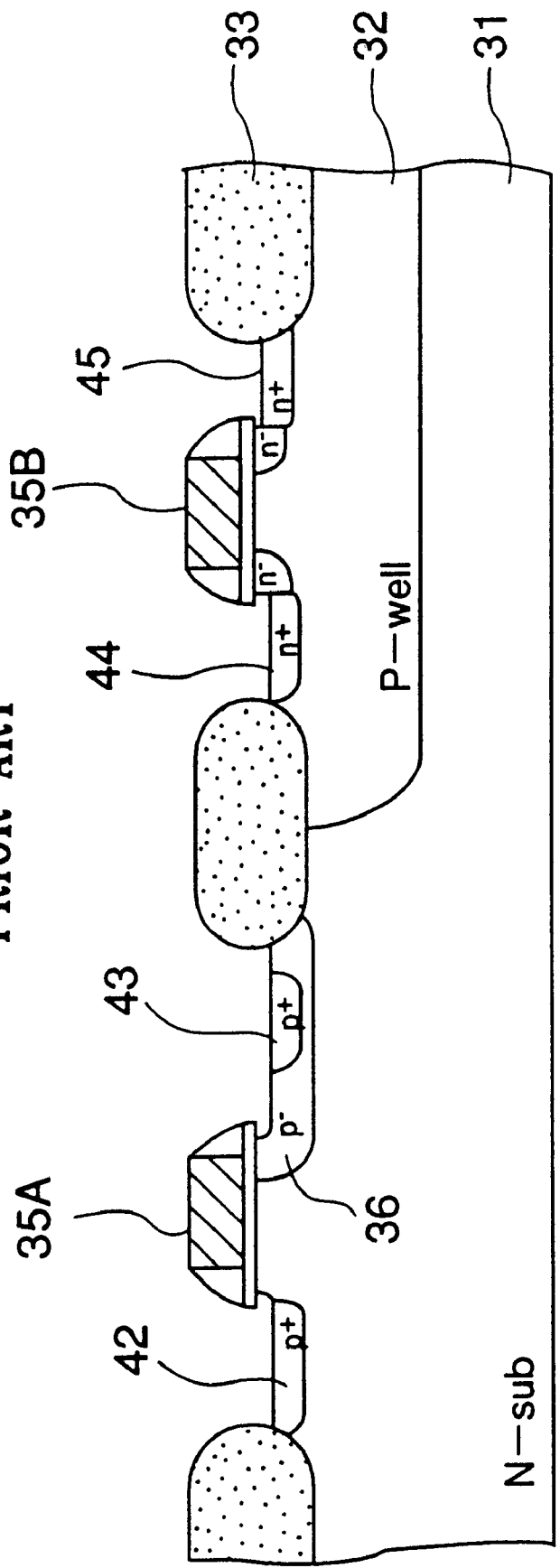
FIG. 5 is a second cross section showing a method for the production of another conventional semiconductor integrated circuit device.

FIG. 15 represents the results of the measurement performed on the conventional high voltage transistor having the P⁻ drain region in an etched state), which indicate the occurrence of a large leak current of the order of $1\times10^{-9}$ A. FIG. 16 represents the results obtained of the conventional transistors having an etching damage layer treated by isotropic etching as described with reference to FIG. 4 and FIG. 5, which indicate the occurrence of a still large leak current of the order of $1\times10^{-11}$ A.

FIG. 17 represents the results obtained of the product of the present embodiment. The data show that the leak current was lower than $1\times10^{-12}$ A, a magnitude notably lower than that of the conventional devices.

Figure 18:
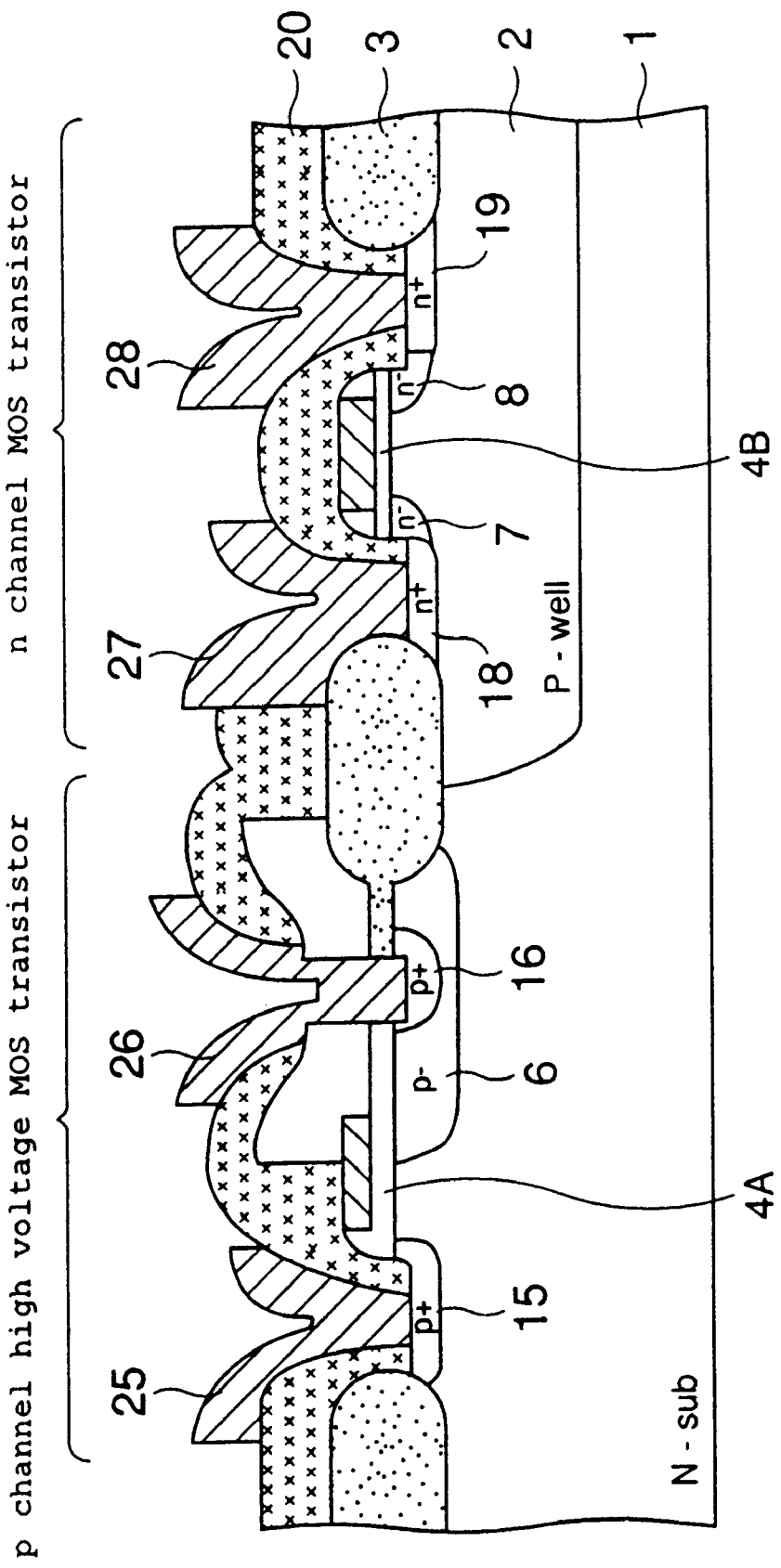
FIG. 18 is a 10th cross section showing a method for the production of a semiconductor integrated circuit device according to an embodiment of this invention.

In the present embodiment, the first gate insulating film 4A and the second gate insulating film 4B have an equal thickness. When the second gate insulating film 4B of normal voltage is formed in a thickness of 150 Å, for example, such a semiconductor integrated circuit device as is shown in FIG. 18 is appropriately formed by giving the first gate insulating film 4A of high voltage MOS transistor a thickness of 400 Å, for example, a greater thickness than the gate insulating film of normal voltage, to ensure a necessary withstand voltage. This increase of the thickness of the first gate insulating film 4A results in further enhancing the TDDB (time dependent dielectric breakdown) characteristics of the high voltage MOS transistor under discussion.

This advantage is accomplished, for example, by a procedure which comprises tentatively oxidizing the whole area of the gates, then removing the gate insulating films of the N channel and the P channel normal voltage MOS transistor except that of a high voltage transistor using resist mask and removing the resist, and thereafter repeating the oxidation of the gates.

What is claimed is:

1. A method for producing a semiconductor integrated circuit device, comprising the steps of:

forming a gate insulating film on a first conduction type semiconductor substrate and forming a gate electrode having sidewalls on said gate insulating film;

selectively introducing a second conduction type impurity atom of low concentration into said semiconductor substrate and thereby allowing such a drain region of low impurity concentration to be formed on the surface of said semiconductor substrate as is matched to the end part of said gate electrode;

forming an insulating film covering said gate electrode and said gate insulating film;

forming a resist film covering said insulating film;

patterning said resist film and thereby forming an opening of said resist film in the area in which said drain region of low impurity concentration is present and at the same time, extending said resist film from said opening over said gate electrode to leave only one sidewall of said gate electrode uncovered with resist;

etching said insulating film using said patterned resist film as an etching mask and thereby removing said insulating film in the area of said drain region of low impurity concentration using said opening and, at the same time, forming lateral wall spacers of said insulating film on said one sidewall of said gate electrode; and introducing the second conduction type impurity of high concentration using said gate electrode and said insulating film as an introducing mask and thereby forming by a self aligning method a source region of high impurity concentration on said semiconductor substrate on the side opposed to said drain region of low impurity concentration across said gate electrode and, at the same time, forming a drain region of high impurity concentration in the surface region of said drain region of low impurity concentration.

2. The method according to claim 1, wherein said opening produced at the step of forming an opening in part of the area in which said drain region of low impurity concentration is formed in said resist film is formed substantially at the center of the area in which said drain region of low impurity concentration is formed.

3. A method for producing a semiconductor integrated circuit device provided with a first MOS transistor and a second MOS transistor which has a higher breakdown voltage than said first MOS transistor, comprising the steps of:

forming a second conduction type well region on a first conduction type semiconductor substrate by the introducing of a second conduction type impurity atom;

forming a selective oxide film on the surface of said semiconductor substrate and thereby separating said semiconductor substrate into the area having said second conduction type well is formed and the area having no second conduction type well is formed;

forming a first gate insulating film on the surface of said semiconductor substrate in the area in which said second conduction type well region is not formed and a second gate insulating film on the surface of said second conduction type well region;

forming a first gate electrode having sidewalls on said first gate insulating film and a second gate electrode having sidewalls on said second gate insulating film;

selectively introducing a second conduction type impurity atom so as to be matched to the end of said second gate electrode and thereby forming a drain region of low impurity concentration of said second MOS transistor;

selectively introducing a first conduction type impurity atom so as to be matched to the end of said first gate electrode and thereby forming a source/drain region of low impurity concentration of said first MOS transistor;

forming an insulating film so as to cover said selective oxide film, said first and second gate electrode, and said first and second gate insulating film;

forming a resist film covering said insulating film;

patterning said resist film and thereby forming an opening of said resist film in the area in which said drain region of low impurity concentration is present and at the same time, extending said resist film from said opening over said first gate electrode to leave only one sidewall of said gate electrode uncovered with resist;

anisotropically etching said insulating film using said patterned resist film as an etching mask and thereby removing said insulating film in the area of said drain region of low impurity concentration using said opening and, at the same time, forming lateral wall spacers of said insulating film on said one sidewall wall of said first gate electrode and lateral wall spacers of said insulating film on said sidewalls of said second gate electrode;

introducing the second conduction type impurity of high concentration using a resist film formed on a forming region of said second transistor, said second gate electrode and said insulating film and said lateral wall spacers as an introducing mask and thereby forming by a self aligning method a second MOS transistor source region of high impurity concentration on said semiconductor substrate on the side opposed to said drain region of low impurity concentration across said second gate electrode and, at the same time, forming a second MOS transistor drain region of high impurity concentration in the surface region of said drain region of low impurity concentration; and introducing the first conduction type impurity of high concentration using a resist film formed on a forming region of said second transistor, said first gate electrode and said insulating film and said both side lateral wall spacers of said first gate electrode as an introducing mask and thereby forming by a self aligning method a source region and drain region of said first MOS transistor.

4. The method according to claim 3, wherein said opening produced at the step of forming an opening in said resist film existing at part of the area in which said drain region of low impurity concentration is formed substantially at the center of the area in which said drain region of low impurity concentration is formed.

5. The method according to claim 3, wherein a CVD oxide film is formed by the CVD technique at the step of forming an insulating film for covering said first and second gate electrode and said first and second gate insulating film.

* * * * *